(12) United States Patent  
Nakaigawa

(10) Patent No.: US 6,232,908 B1
(45) Date of Patent: May 15, 2001

(54) A/D CONVERTER HAVING A DYNAMIC ENCODER

(75) Inventor: Sachio Nakaigawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/161,703

(22) Filed: Sep. 29, 1998

(30) Foreign Application Priority Data

Sep. 29, 1997 (JP) .................................................... 9-262584

(51) Int. Cl.⁷ .................................................. H03M 1/36
(52) U.S. Cl. ............................................. 341/160; 341/155
(58) Field of Search ..................................... 341/160, 156, 341/155, 161

(56) References Cited

U.S. PATENT DOCUMENTS

| | | | |
|---|---|---|---|
| 4,733,220 | * | 3/1988 | Knierim .................................. 341/156 |
| 5,140,188 | * | 8/1992 | Burns .................................... 307/362 |
| 5,631,593 | * | 5/1997 | Molin .................................... 327/277 |
| 5,959,564 | * | 9/1999 | Gross, Jr. ............................... 341/160 |
| 6,028,545 | * | 2/2000 | Chen .................................... 341/156 |

FOREIGN PATENT DOCUMENTS

| | | |
|---|---|---|
| 1-307318 | 12/1989 | (JP) . |
| 7-202699 | 8/1995 | (JP) . |
| 8-36466 | 2/1996 | (JP) . |
| 8-293795 | 11/1996 | (JP) . |
| 9-8662 | 1/1997 | (JP) . |

* cited by examiner

Primary Examiner—Peguy JeanPierre
(74) Attorney, Agent, or Firm—McGinn & Gibb, PLLC

(57) ABSTRACT

An A/D converter includes a resistor ladder for generating a plurality of reference potentials, a comparing section for comparing each of the reference potentials against an input analog signal to output a thermometric code, and a dynamic encoder composed of a combinational circuit to encode the thermometric code to a binary code by responding a clock signal. The A/D conversion is finished in a single clock cycle at a high speed, with a reduced number of elements and reduced power dissipation.

17 Claims, 9 Drawing Sheets

| ANALOG INPUT | IDEAL THERMOMETRIC CODE | NON-IDEAL THERMOMETRIC CODE | BINARY CODE |
|---|---|---|---|
| LEVEL FOUR (100) | 1 1 1 1 0 0 0<br>(MSB)   (LSB) | 1 1 1 0 1 0 0<br>(MSB)   (LSB) | 0 1 1 |

FIG. 9
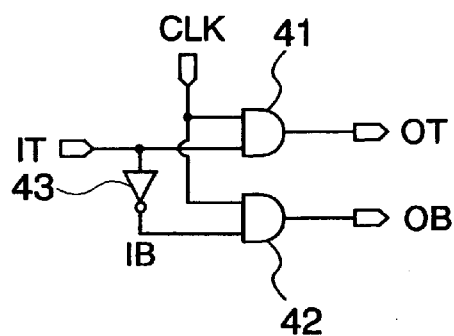
FIG. 10
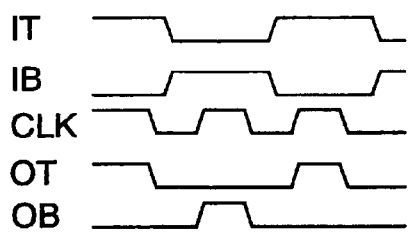
FIG. 11
| ANALOG INPUT | IDEAL THERMOMETRIC CODE | NON-IDEAL THERMOMETRIC CODE | BINARY CODE |
|---|---|---|---|
| LEVEL FOUR (100) | 0 0 0 1 1 1 1<br>(MSB)    (LSB) | 0 0 1 0 1 1 1<br>(MSB)    (LSB) | 0 1 1 |

FIG. 12

| DECIMAL CODE | IDEAL THERMOMETRIC CODE (MSB) (LSB) | NON-IDEAL THERMOMETRIC CODE (MSB) (LSB) | BINARY CODE | ERROR IN DECIMAL FORMAT |
|---|---|---|---|---|
| 0 | 0000000 | 0000001 | 001 | +1 |
| 1 | 0000001 | 0000010 | 010 | +1 |
| 2 | 0000011 | 0000101 | 001 | −1 |
| 3 | 0000111 | 0010111 | 100 | +1 |
| 4 | 0001111 | 0010111 | 011 | −1 |
| 5 | 0011111 | 0101111 | 110 | +1 |
| 6 | 0111111 | 1011111 | 101 | −1 |
| 7 | 1111111 | 0111111 | 110 | −1 |

A/D CONVERTER HAVING A DYNAMIC ENCODER

BACKGROUND OF THE INVENTION (a) Field of the Invention

The present invention relates to an analog-to-digital converter (A/D converter) having a dynamic encoder and, more particularly to an A/D converter having a dynamic encoder for encoding a thermometric code into a binary code.

(b) Description of the Related Art

A/D converter is widely used to converting an input analog signal to a digital code which can be processed by a computer system. Referring to FIG. 1 showing a conventional A/D converter called a flash A/D converter in JP-A-8-36466 (from Texas Instrument), wherein an input analog signal of a thermometric code is directly converted by using a dichotomizing search technique to output a binary code without generating an intermediate code. The flash A/D converter includes a comparator array 51 including a plurality of comparators 52, and dichotomizing search encoder 53 including a plurality of D-flip-flops 54 and 56, and a plurality of multiplexers 55. The A/D converter has an advantage of reduction of the maximum sparkle error to a minimum. That is, the A/D converter has an advantage in that an input thermometric code having a bubbling error provides an output signal with an error as low as within one bit after error correction compared to the case in which an ideal thermometric code is input.

Specifically, referring to FIG. 2 showing the results of conversion after error correction in the A/D converter of FIG. 1, an input analog signal of "level four" or a digital code "100" corresponding to an ideal thermometric code of (1111000) is input to the A/D converter, which achieves a binary code (011) after correction of error caused by bubbling. That is, the conventional A/D converter achieves an error within 1-bit level after the error correction.

The conventional flash A/D converter using a dichotomizing search technique as described above, however, has a problem in that the conversion rate or conversion speed thereof reduces in proportion to the increase of the number of bits of the input thermometric code. This is because the dichotomizing search technique in its nature can start the search for m-th bit in an N-bit code ($0 \leq m \leq N-2$) only after the search for (m+1)-th bit and more significant bits is completed.

In other words, N-bit code of the output digital signal requires N times for search by the A/D converter because of the inter-bit dependency in the dichotomizing search technique, which limits the conversion rate of the A/D converter.

The conventional A/D converter has another problem in that the circuit scale and the power dissipation thereof increases with the increase of the number (N) of bits to be converted. This is partly because there is a phase difference between the most significant bit (MSB) and the least significant bit (LSB) of the code after the conversion, which requires timing flip-flops or latches in number corresponding to the number (N) of bits, partly because the search results for m+1)-th bit and more significant bits must be stored during the search for m-th bit, which requires the latches for storage in number corresponding to number of ($2^N-1$), and partly because the dichotomizing search requires switching circuits in number corresponding to $$\sum_{i=1}^{N-1} (2^i - 1). \tag{1}$$

That is, if the number of bits is N, the A/D converter includes elements in number equal to:

$$(N + (2^N - 1)) \times 8 + \left[ \sum_{i=1}^{N-1} (2^i - 1) \right] \times 4, \tag{2}$$

provided that D-flip-flops and multiplexers are implemented by eight elements and four elements, respectively. If N=3, for example, then the number of elements is as large as 96.

SUMMARY OF THE INVENTION

It is an object of the present invention to provide an improved A/D converter which has an improved function for high-speed conversion of a thermometric code to a binary code without losing an error correcting function, and which has a reduced circuit scale and reduced power dissipation.

It is another object of the present invention to provide a method for converting a thermometric code to a binary code, for use in an A/D converter without losing an error correcting function, at a high speed with a reduced circuit scale and reduced power dissipation.

The present invention provides an A/D converter comprising a reference voltage generator for generating a plurality of reference voltages, a comparing section including a plurality of comparing elements each comparing an input analog signal against a corresponding one of the reference voltages to output a thermometric code, and a dynamic encoder including a plurality of bit lines and a dynamic combinational circuit transferring the thermometric code to the bit lines by responding to a clock signal so that the thermometric code is converted in a single clock cycle to a binary code generated on the bit lines and corresponding to a magnitude of the input analog signal.

In accordance with the A/D converter of the present invention, since the conversion does not involve the inter-bit dependency, the conversion can be achieved in a single clock cycle so that the conversion rate of the A/D converter is improved. In addition, the circuit scale and power dissipation thereof can be reduced because the timing flip-flops or latches are not necessary in the present invention.

The present invention also provides a method for converting a thermometric code to a binary code, comprising the steps of comparing an input analog signal against a corresponding one of a plurality of reference voltages to output a thermometric code, and transferring the thermometric code to a plurality of bit lines by responding to a clock signal so that the thermometric code is converted to a binary code generated on the bit lines and corresponding to a magnitude of the input analog signal in a single clock cycle.

In accordance with the method according to the present invention, advantages similar to those as described with reference to the A/D converter of the present invention can be obtained.

The above and other objects, features and advantages of the present invention will be more apparent from the following description, referring to the accompanying drawings.

BRIEF DESCRIPTION OF THE DRAWINGS

FIG. 9 is a block diagram of a complementary signal output circuit shown in FIG. 8;

FIG. 10 is a signal timing chart of the complementary signal output circuit of FIG. 9;

FIG. 11 is a table for showing the function of the A/D converter according to the embodiments of the present invention; and FIG. 12 is a table for showing the function of the A/D converter according to the embodiments of the present invention.

PREFERRED EMBODIMENTS OF THE INVENTION

Figure 1:
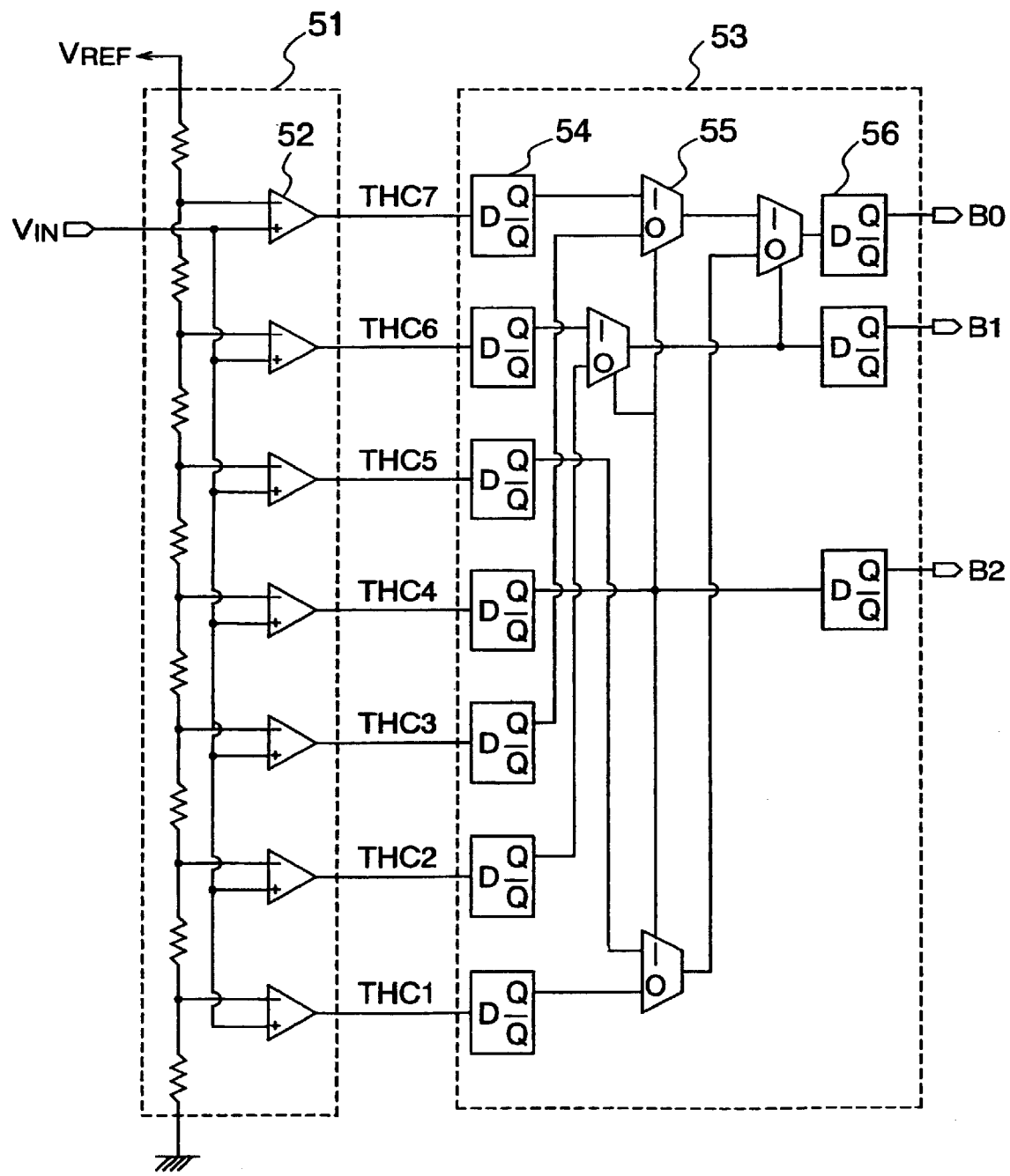
FIG. 1 is a block diagram of a conventional A/D converter for conversion of a thermometric code to a binary code.

Now, the present invention is more specifically described with reference to accompanying drawings, wherein similar constituent elements are designated by similar reference numerals.

Figures 2, 3:
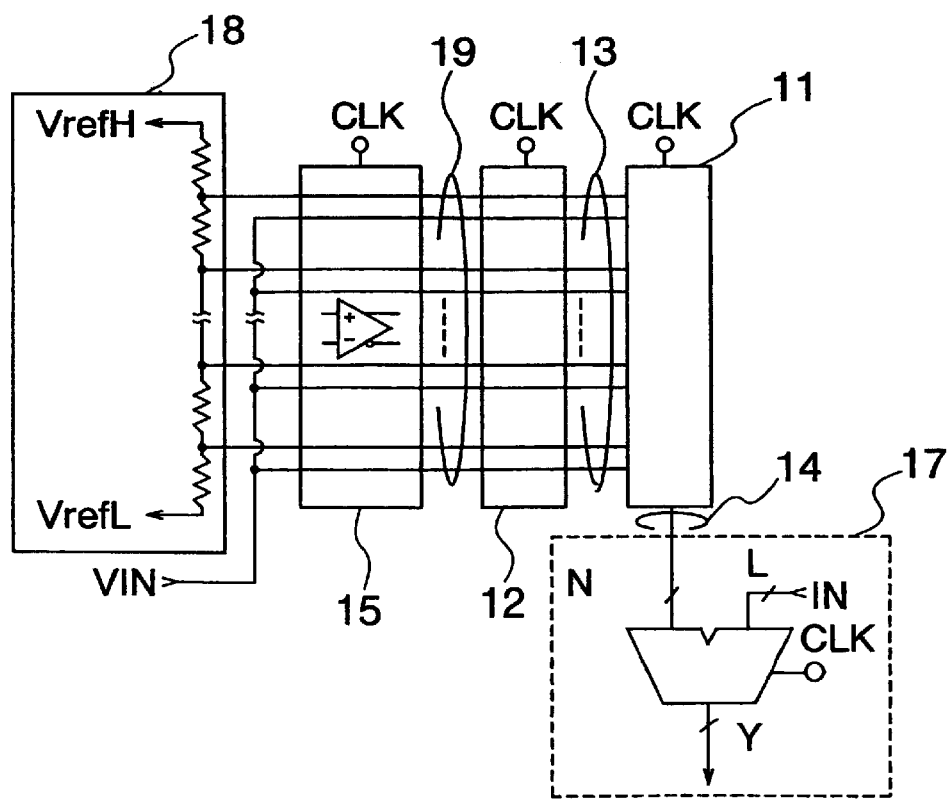
FIG. 2 is a table for showing the function of the A/D converter of FIG. 1.
FIG. 3 is a schematic block diagram of an A/D converter according to a principle of the present invention.

Referring to FIG. 3 showing the principle of the A/D converter of the present invention, the A/D converter includes a resistor ladder 18 for generating a plurality of reference voltages having a step difference therebetween, a comparator array 15 for comparing an input analog signal $V_{IN}$ against respective reference voltages from the resistor adder 18 by responding to a clock signal CLK to output signals 19 having small amplitude such as an ECL (emitter coupled logic) level amplitude, a level converter array 12 for receiving the small amplitude signals 19 from the comparator array 15 by responding to the clock signal CLK to output a thermometric code 13 of a complementary signal having a CMOS level amplitude, and a dynamic encoder 11 for receiving a thermometric code 13 from the level converter array 12 to output a binary code 14 in synchrony with the clock signal CLK. The A/D converter may include as shown in FIG. 3, a digital adder 17 for receiving a binary code 14 of N bits from the dynamic encoder 11 in synchrony therewith to output an output digital code having Y bits.

Each comparator in the comparator array and a corresponding one of the level converters in the level converter array may be called a comparing element which compares an input analog signal against a reference voltage to output a bit of a thermometric code.

The input section (or encoding section) for receiving the thermometric code 13 from the level converter array 12 and the output section (such as bit lines) for outputting the binary code 14 in the dynamic encoder 11 are coupled to each other so that the code conversion satisfies the following relationship:

$$b_m = \sum_{i=1}^{2^{(m-1)}} (C(t_x) \times t_y) \quad (3)$$

wherein $b_m$ is a m-th bit counted from the MSB in the binary code ($1 \leq m \leq N$), $t_x$ is the x-th bit counted from the MSB in the thermometric code ($0 \leq x \leq 2^N - 2$), $t_y$ is the y-th bit counted from the MSB in the thermometric code ($1 \leq y \leq 2^n - 1$), $C(t_x)$ is a complement of $t_x$ in the thermometric code, $x = 2(i-1) \times 2^{(N-m)}$, $y = \{2(i-1)+1\} \times 2^{(N-m)}$, and $C(t_0) = 1$.

The code conversion from the thermometric code to the binary code is effected by using the Boolean algebra equation (3).

Figure 4:
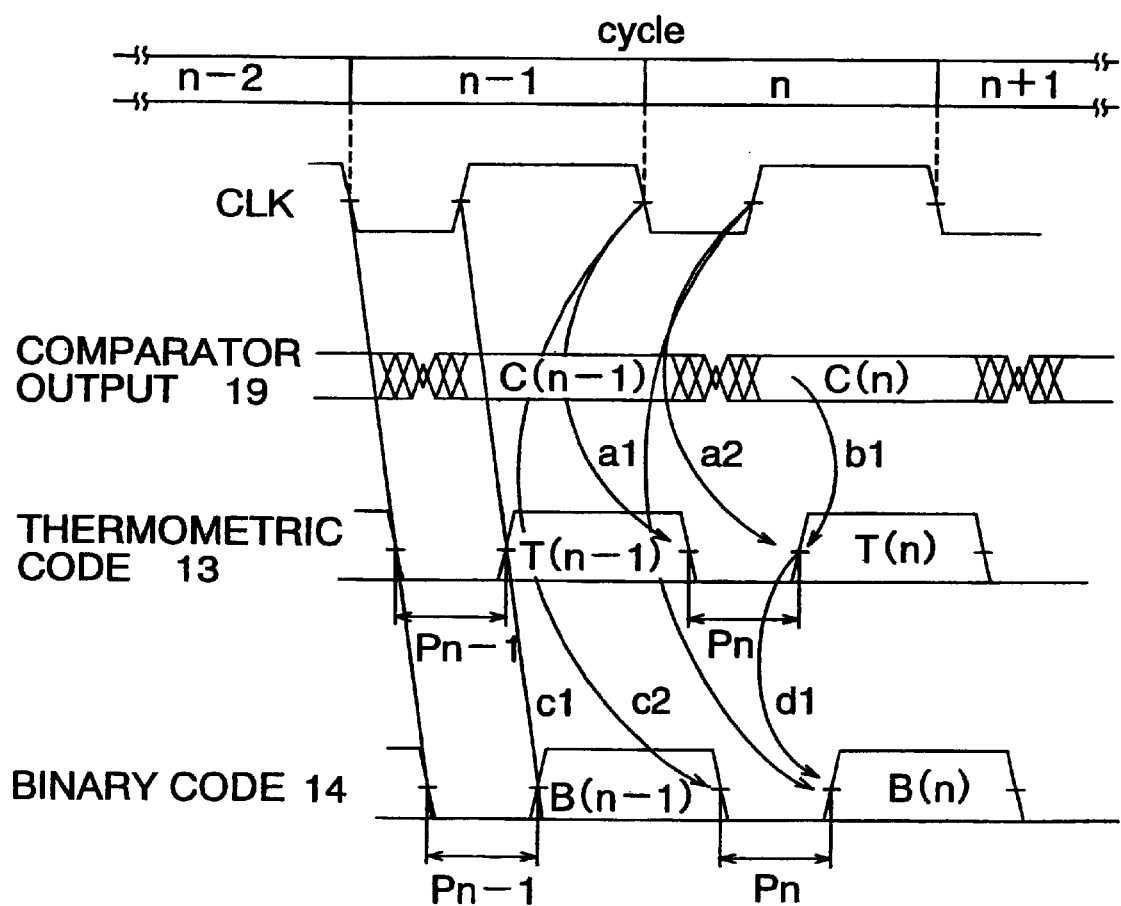
FIG. 4 is a signal timing chart in the A/D converter of FIG. 3.
Figure 5:
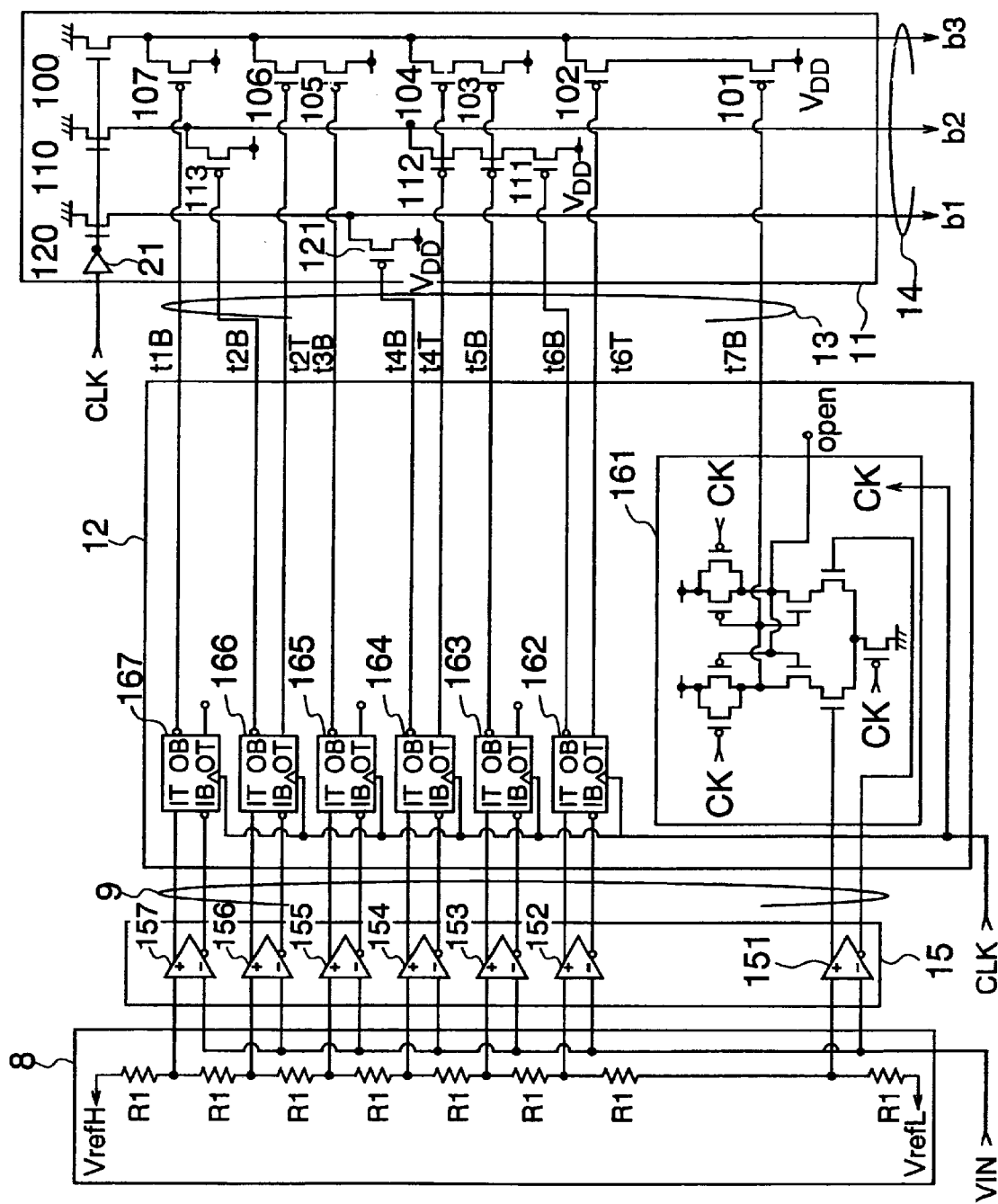
FIG. 5 is a block diagram of an A/D converter according to a first embodiment of the present invention.

Referring to FIG. 4, the signal timing chart of the A/D converter of FIG. 5 shows a state for converting an input analog signal at n-th clock cycle to a binary code B(n). First, the level converter array 12 and the dynamic encoder 11 are subjected to a precharge operation at the time intervals Pn between time instants a1 and a2 and between time instants c1 and c2, respectively, by responding to a falling edge and a rising edge of the n-th cycle clock pulse.

Subsequently, the level converter array 12 receives an output C(n) from the comparator array 15 at time instant b1 by responding to the rising edge of the n-th cycle clock pulse to output a complementary thermometric code T(n). The dynamic encoder 11 converts the complementary thermometric code T(n) to a binary code B(n) and outputs the same during n-th clock cycle at time instant d1, thereby outputting the binary code B(n) within a single clock cycle.

Referring to FIG. 5, an A/D converter according to a first embodiment of the present invention has a resistor ladder 18 having a plurality (seven in this example) of nodes between each adjacent two of eight resistors R1 and connected between source lines $V_{refH}$ and $V_{refL}$, a comparator array 15 including an array of comparators 151 to 157 each for comparing an input analog signal $V_{IN}$ against a corresponding reference voltage supplied from a corresponding node of the resistor ladder 18, a level converter array 12 including an array of level converters 161 to 167 each corresponding to one of the comparators 151 to 157 for outputting a complementary thermometric code 13, and a dynamic encoder 11 for encoding the complementary thermometric code 13.

Each of the level converters (or sense amplifiers) 161 to 167 is implemented by a differential circuit activated by the clock signal CLK for amplifying a small amplitude differential signal output from a corresponding one of the comparators 151 to 157. Each comparator outputs a high level and a low level to the non-inverting input IT and inverting input IB, respectively, of a corresponding one of the level converters 161 to 16 when the input analog signal $V_{IN}$ is higher than a corresponding reference voltage. The level converters amplify the respective differential signals 19 to output a complementary thermometric code 13 through the non-inverting outputs TO and the inverting outputs OB thereof.

The dynamic encoder 11 has three bit lines b1, b2 and b3 connected to the ground through n-channel (n-ch) transistors 120, 110 and 100, respectively, which receives the clock signal CLK through an inverter 21. Bit line b1 is connected to the source line $V_{DD}$ through a p-ch transistor 121, which receives signal t4B in the thermometric code from the inverting output OB of the fourth level converter 164 receiving V/2 from the resistor adder 18, wherein V is the voltage between $V_{refH}$ and $V_{refL}$. The inverting output OB of the fourth level converter 164 assumes a low level when the input analog signal $V_{IN}$ is higher than V/2. Accordingly, bit line b1 is at a high level when the input analog signal is higher than V/2, as shown in FIG. 6.

Bit line b2 is connected to the source line $V_{DD}$ through p-ch transistor 113 having a gate receiving a signal t2B from the inverting output OB of the sixth level converter 166, and through serially connected p-ch transistors 112 and 111. The transistor 112 has a gate receiving a signal t4T from the non-inverting output OT of the fourth level converter 164, the transistor 111 has a gate receiving a signal t6B from the inverting output OB of the second level converter 162. By these configurations, if the input voltage is higher than 3 V/4 or between V/4 and V/2, the bit line b2 is at a high level, as shown in FIG. 6.

Bit line b3 is connected to source line $V_{DD}$ through a p-ch transistor 107, serially connected p-ch transistors 105 and 106, serially connected to p-ch transistors 101 and 102. The transistors 101 to 107 have gates receiving a signal t7B from the inverting output OB of the first level converter 161, a signal t6T from the non-inverting output OT of the second level converter 162, a signal t5B from the inverting output OB of the third level converter 163, a signal t4T from the non-inverting output OT of the fourth level converter 164, a signal t3B from the inverting output OB of the fifth level converter 165, a signal t2T from the non-inverting output OT of the sixth level converter 166 and a signal t1B from the inverting output OB of the seventh level converter 167, respectively.

Figure 6:
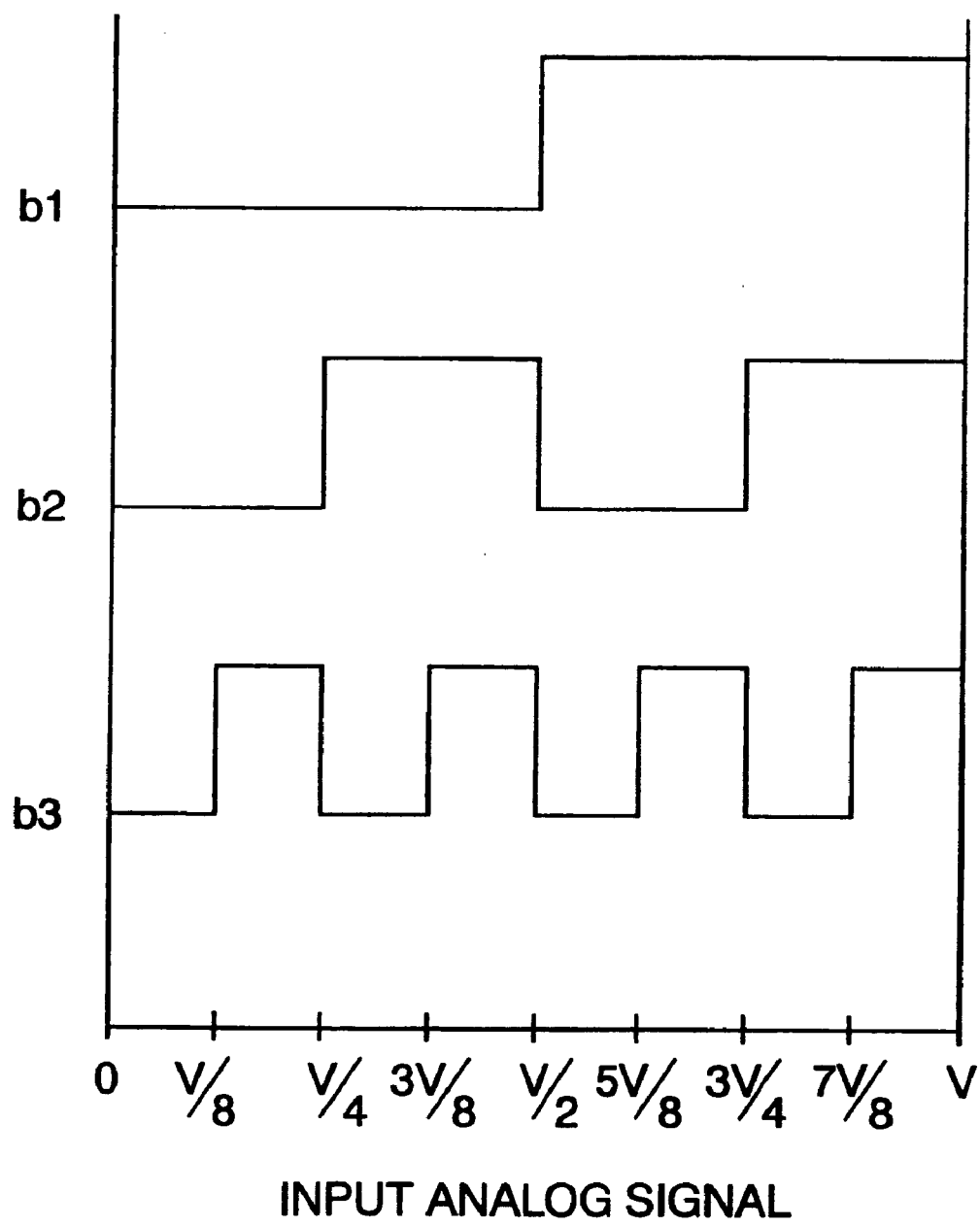
FIG. 6 is graph for showing the relationship between the output code on the bit lines and the input analog signal.

By these configurations, the bit line b3 is at a high level when the input signal resides between V/8 and V/4, 3 V/8 and V/2, and 5 V/8 and 3 V/4, and above 7 V/8, as shown in FIG. 6. The three-bit code output from the bit lines b1 to b3 may be converted to a desired bit code by an adder such as the adder 17 shown in FIG. 3. In a more generic configuration, the encoding section implemented by p-ch transistors and the bit liens b1, b2 and b3 are coupled so that conversion by the dynamic encoder 11 satisfies the equation (3) as mentioned before.

It will be understood that the value of each bit of the output binary code 14 on the bit lines b1 to b3 does not depend on other bits, and accordingly, the A/D conversion by the A/D converter of the present embodiment can be operated in a single clock cycle at a higher speed and without using a latch circuit.

In the illustrated configuration for the exemplified three-bit code, the dynamic encoder 11 has n-ch precharge transistors 100, 110 and 120, inverter 21, and p-ch transistors 101 to 107, 111 to 113 and 121, which may be composed of fourteen transistor elements. More generally, for a N-bit configuration, the number of the transistor elements in the dynamic encoder 11 can be expressed by the following formula:

$$2 \times \sum_{i=0}^{N-1} 2^i$$

Figure 7:
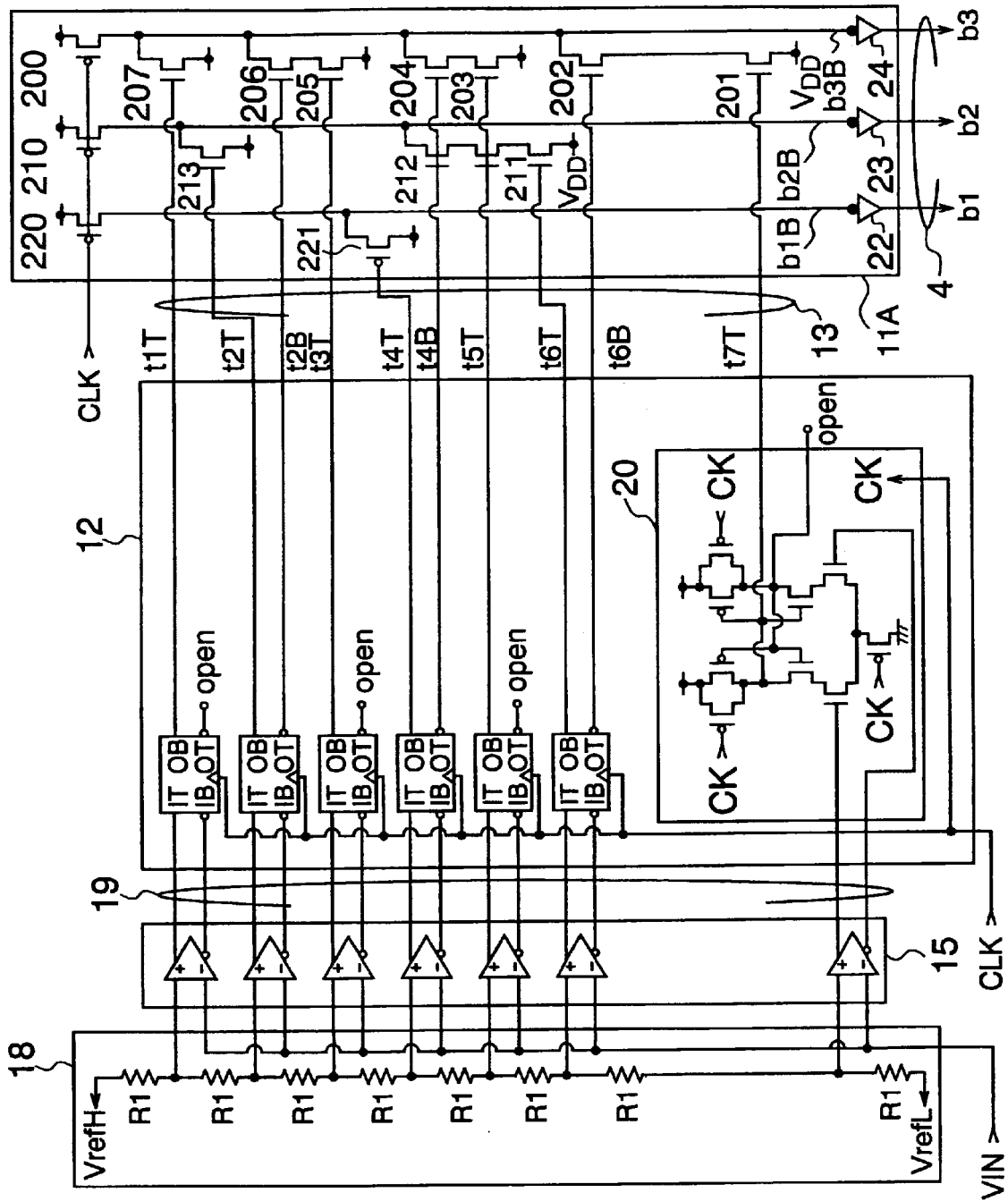
FIG. 7 is a block diagram of an A/D converter according to a second embodiment of the present invention.

Referring to FIG. 7, an A/D converter according to a second embodiment of the present invention is similar to the first embodiment except for the dynamic encoder 11A having an encoding section including n-ch transistors 201 to 207, 211 to 213 and 221 which connect the bit lines b1B to b3B to the ground instead of source line, precharge section including p-ch transistors 200, 210 and 220 instead of n-ch transistors, and inverters 22 to 24 disposed at the output ends of the respective bit lines b1B to b3B. To adapt with the configuration of the second embodiment, the thermometric code 13 supplied from the level converter array 12 to the respective n-ch transistors 201 to 207, 211 to 213 and 221 is reversed to a negative logic code.

In the second embodiment, the code on the bit lines b1B to b3B is reversed by the inverter 22 to 24, and the outputs of the inverters 22 to 24 are similar to those shown in FIG. 6. By the configurations of FIG. 7, a further high-speed encoding can be obtained because the n-ch transistors can discharge the bit lines b1B to b3B to the ground level more quickly than the p-ch transistors charge the bit line b1 to b3 to a source potential in the first embodiment. Alternatively, a smaller occupied area can be obtained due to small size n-ch transistors if a similar encoding rate is sufficient.

Figure 8:
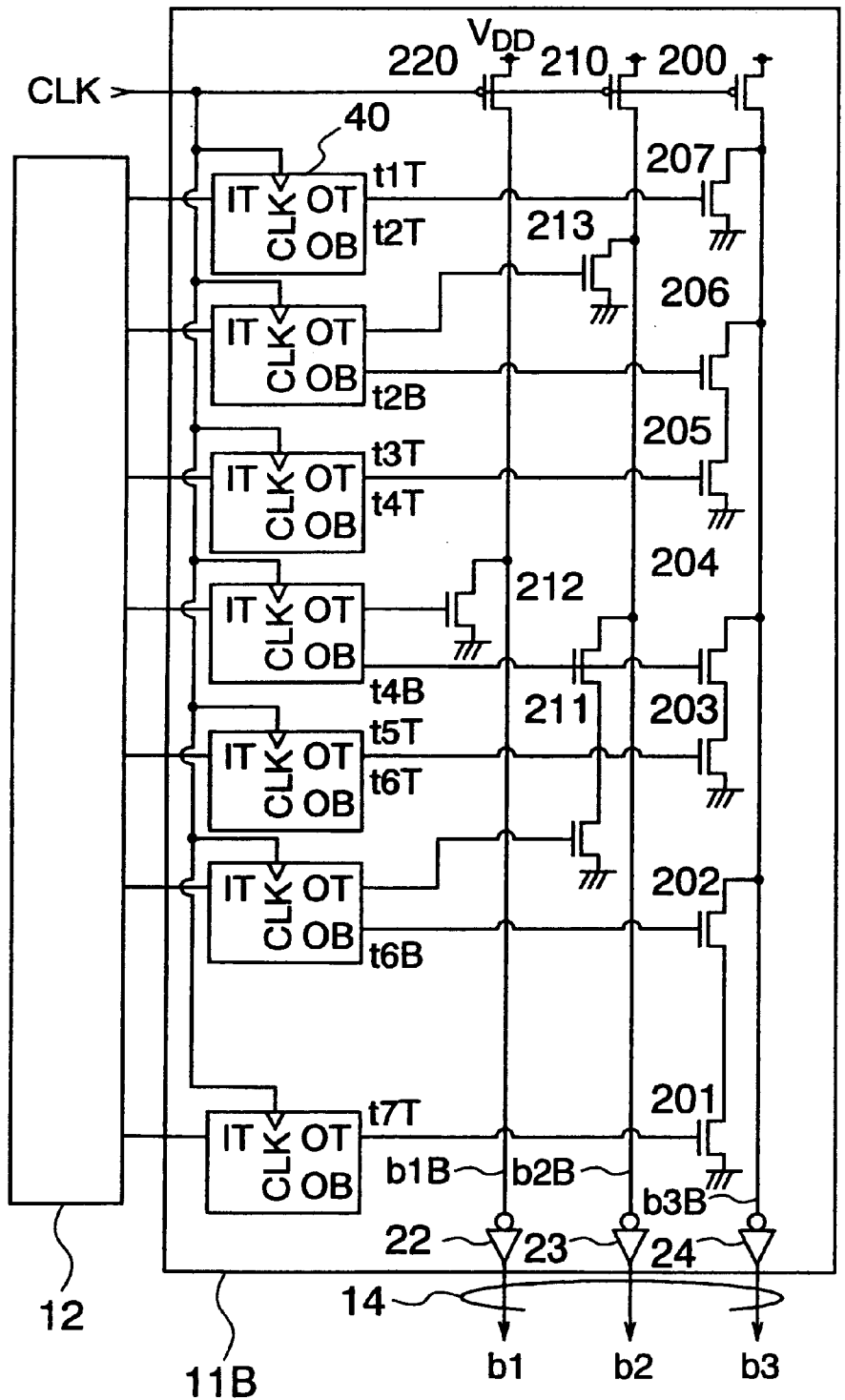
FIG. 8 is a block diagram of a dynamic encoder in an A/D converter according to a third embodiment of the present invention.

Referring to FIG. 8, a dynamic encoder 11B in an A/D converter according to a third embodiment of the present invention has an array of complementary signal generators 40, and an encoding section, precharge section and bit lines similar to those shown in FIG. 7. The complementary signal generators 40 have a dynamic configuration and receive outputs, which assume a high level when the input analog signal is higher than the respective reference voltages, from the level converter array 12. Referring to FIG. 9, the complementary signal generator 40 includes an inverter 43 and a pair of AND gates 41 and 42. The AND gate 41 receives the clock signal CLK and an output IT from the level converter 12 to output a non-inverting thermometric code bit OT, whereas the AND gate 42 receives an output from the inverter 43 receiving output IT from the level converter 12 to output an inverting thermometric code bit OB.

Referring to FIG. 10 showing the signal timing chart of the complementary signal generator 40 shown in FIG. 9, the thermometric code bit OT and bit OB from the AND gates 41 and 42 are similar to those from the level converter shown in FIG. 7 at the precharge period and the signal transfer period of the clock signal CLK. In other words, the encoding section can receive thermometric code in synchrony with the clock signal. That is, the circuit sections in the A/D converter according to the present invention other than the encoder 11 (or 11A, 11B)need not be dynamic circuits, and it is sufficient that the result of the comparison be a dynamic complementary signal at the input of the encoding section. The term "dynamic circuit" as used herein means that the circuit operates by responding to a clock signal.

FIG. 11 shows a table showing the result of conversion of a specified input analog value (level four) obtained by the A/D converter having an error correcting function. When an analog input signal of level four (corresponding to code 100) which corresponds to ideal thermometric code of (0001111) is supplied, a possible error is limited to one bit assuming that a bubbling error occurs which corresponds to the thermometric code of (0010111).

Referring to FIG. 12 showing the possible cases of three-bit codes, all the possible errors after correction by the correcting function can be restricted within ±1 in a decimal format from the exact converted values for all the possible input levels 0 to 7.

In the above embodiment, the conversion rate by the A/D converter remains substantially the same even if the number of bits to be output is increased, because the conversion rate does not depend on the number of bits, which is different from the A/D converter using a dichotomizing search technique.

Further, the encoding section of the encoder can be formed by either p-ch transistors or n-ch transistors, which enables a higher conversion rate because of a lower input capacitance which is nearly a half compared to the input capacitance of the logic circuit implemented by CMOS transistors.

Since the above embodiments are described only for examples, the present invention is not limited to the above embodiments and various modifications or alterations can be easily made therefrom by those skilled in the art without departing from the scope of the present invention.

What is claimed is:

1. An analog-to-digital (A/D) converter comprising:
   a reference voltage generator for generating a plurality of reference voltages;
   a comparing section including a plurality of comparing elements each comparing an input analog signal against a corresponding one of said reference voltages to output a thermometric code; and
   a dynamic encoder including a plurality of bit lines and a dynamic combinational circuit transferring said thermometric code to said bit lines by responding to a clock,
   wherein said input analog signal is converted in a single clock cycle to a binary code generated on said bit lines and corresponding to a magnitude of said input analog signal;
   wherein a rate of conversion is substantially independent of a number of bits to be output,
   wherein each comparing element of said comparing section comprises a comparator and a level converter for amplifying an output from said comparator by responding to a clock signal, and,
   wherein said level converter comprises CMOS transistors.

2. An A/D converter as defined in claim 1, wherein said combinational circuit comprises a complementary signal generator activated by a clock signal.

3. An A/D converter as defined in claim 1, wherein said level converter outputs a complementary signal.

4. An A/D converter as defined in claim 1, wherein said dynamic encoder comprises a non-dichotomizing search encoder.

5. An A/D converter as defined in claim 1, wherein said A/D converter contains an error correcting function.

6. An A/D converter as defined in claim 1, wherein said A/D converter is devoid of latches.

7. An A/D converter as defined in claim 1, wherein said thermometric code is converted to said binary code at a rate which is not dependent upon the number of bits to be output.

8. An A/D converter as defined in claim 1, wherein the value of each bit of the output binary code does not depend on values of other bits.

9. An A/D converter as defined in claim 1, wherein said dynamic encoder further comprises one of p-channel transistors and n-channel transistors.

10. An A/D converter as defined in claim 1, wherein said reference voltage generator comprises a resistor ladder having a plurality of nodes adjacent two resistors and connected between a high voltage source and a low voltage source.

11. An A/D converter as defined in claim 1, wherein said dynamic encoder further comprises an encoding section having n-channel transistors which connect said bit lines to a ground, a precharge section having p-channel transistors, and inverters at output ends of said bit lines.

12. An A/D converter as defined in claim 11, wherein said dynamic encoder further comprises an array of complementary signal generators which have a dynamic configuration and receive outputs from said level converter.

13. An A/D converter as defined in claim 12, wherein each said complementary signal generator comprises an inverter and two AND gates.

14. An analog-to-digital (A/D) converter comprising:
    a reference voltage generator for generating a plurality of reference voltages;
    a comparing section including a plurality of comparing elements each comparing an input analog signal against a corresponding one of said reference voltages to output a thermometric code; and
    a dynamic encoder including a plurality of bit lines and a dynamic combinational circuit transferring said thermometric code to said bit lines by responding to a clock,
    wherein said thermometric code is converted in a single clock cycle to a binary code generated on said bit lines and corresponding to a magnitude of said input analog signal, and
    wherein said conversion is expressed by the Boolean algebra equation:

$$b_m = \sum_{i=1}^{2^{(m-1)}} (C(t_x) \times t_y)$$

wherein N is a number of bits of said binary code, $b_m$ is a m-th bit of said binary code counted from most significant bit (MSB), $t_x$ is the x-th bit of said thermometric code counted from MSB, $t_y$ is the y-th bit of said thermometric code counted from MSB, $C(t_x)$ is a complement of $t_x$, $0 \leq x \leq 2^N-2$, $1 \leq y \leq 2^N-1$, $x=2(i-1) \times 2^{(N-m)}$, $y=\{2(i-1)+1\} \times 2^{(N-m)}$, and $1 \leq m \leq N$.

15. An A/D converter as defined in claim 14, further comprising a digital adder for receiving a binary code of N bits from said dynamic encoder in synchronicity therewith to output a digital code having Y bits.

16. A method for converting a thermometric code to a binary code, comprising:
    transferring a thermometric code to a plurality of bit lines by responding to a clock signal, wherein said conversion is expressed by the Boolean algebra equation:

$$b_m = \sum_{i=1}^{2^{(m-1)}} (C(t_x) \times t_y)$$

wherein N is a number of bits of said binary code, $b_m$, is a m-th bit of said binary code counted from most significant bit (MSB), $t_x$ is the x-th bit of said thermometric code counted from MSB, $t_y$ is the y-th bit of said thermometric code counted from MSB, $C(t_x)$ is a complement of $t_x$, $0 \leq x \leq 2^N-2$, $1 \leq y \leq 2^N-1$, $x=2(i-1) \times 2^{(N-m)}$, $y=\{2(i-1)+1\} \times 2^{(N-m)}$, and $1 \leq m \leq N$.

17. A method as defined in claim 16, wherein said conversion is conducted in a single clock cycle.

* * * * *